United States Patent
Shimizu

(10) Patent No.: US 11,225,719 B2
(45) Date of Patent: *Jan. 18, 2022

(54) CONCENTRATION CONTROLLER, GAS CONTROL SYSTEM, DEPOSITION APPARATUS, CONCENTRATION CONTROL METHOD, AND PROGRAM RECORDING MEDIUM FOR CONCENTRATION CONTROLLER

(71) Applicant: HORIBA STEC, CO., LTD., Kyoto (JP)

(72) Inventor: Toru Shimizu, Kyoto (JP)

(73) Assignee: HORIBA STEC, CO., LTD., Kyoto (JP)

(*) Notice: Subject to any disclaimer, the term of this patent is extended or adjusted under 35 U.S.C. 154(b) by 386 days.

This patent is subject to a terminal disclaimer.

(21) Appl. No.: 16/217,778

(22) Filed: Dec. 12, 2018

(65) Prior Publication Data

US 2019/0177850 A1 Jun. 13, 2019

(30) Foreign Application Priority Data

Dec. 13, 2017 (JP) .............................. JP2017-239098

(51) Int. Cl.
*C23C 16/44* (2006.01)
*C23C 16/52* (2006.01)
*H01L 21/67* (2006.01)

(52) U.S. Cl.
CPC ........ *C23C 16/52* (2013.01); *H01L 21/67017* (2013.01); *H01L 21/67253* (2013.01)

(58) Field of Classification Search
CPC .......... C23C 16/4402; C23C 16/45544; C23C 16/405; C23C 16/45578; C23C 16/448;
(Continued)

(56) References Cited

U.S. PATENT DOCUMENTS 4,262,686 A 4/1981 Heim et al.
6,752,166 B2 6/2004 Lull et al.
(Continued)

FOREIGN PATENT DOCUMENTS

JP 5-251375 9/1993
JP 2004-91917 3/2004
(Continued)

OTHER PUBLICATIONS

Office Action dated Jun. 26, 2019 issued in U.S. Appl. No. 15/911,650.
(Continued)

*Primary Examiner* — Rudy Zervigon
(74) *Attorney, Agent, or Firm* — Greenblum & Bernstein, P.L.C.

(57) ABSTRACT

In a concentration controller that intermittently leads out material gas from a vaporization tank, in order to control the flow rates of carrier and diluent gases so that the concentration of the material gas can be suppressed from overshooting immediately after the start of material gas supply period, the concentration controller is adapted to include: a concentration calculation part that calculates the concentration of the material gas on the basis of an output signal from a concentration monitor; and a set flow rate calculation part that, on the basis of actual concentration calculated by the concentration calculation part, an actual flow rate outputted from a flow rate control device or the set flow rate of the flow rate control device, and a preset target concentration, calculates the initial set flow rate of the flow rate control device.

9 Claims, 5 Drawing Sheets

(58) Field of Classification Search
CPC .. H01L 21/67017; B01D 45/08; B01D 50/002
USPC ............... 118/726, 723 VE; 156/345.29
See application file for complete search history.

(56) References Cited

U.S. PATENT DOCUMENTS

| | | | |
|---|---|---|---|
| 7,438,079 | B2 | 10/2008 | Cohen et al. |
| 8,459,290 | B2 | 6/2013 | Minami et al. |
| 10,245,608 | B2 | 4/2019 | Dufault et al. |
| 10,655,220 | B2 * | 5/2020 | Sakaguchi ........ C23C 16/45523 |
| 2004/0007180 | A1 | 1/2004 | Yamasaki et al. |
| 2014/0020764 | A1 | 1/2014 | Woelk et al. |
| 2015/0173647 | A1 | 6/2015 | Orr et al. |
| 2016/0047047 | A1 | 2/2016 | Moroi |
| 2018/0258530 | A1 * | 9/2018 | Sakaguchi ........ C23C 16/45512 |

FOREIGN PATENT DOCUMENTS

| | | |
|---|---|---|
| JP | 2006-222133 | 8/2006 |
| JP | 2014-196537 | 10/2014 |
| JP | 2014-530673 | 11/2014 |
| JP | 2014-224307 A | 12/2014 |
| TW | 201246294 | 11/2012 |
| WO | 2013/042024 | 3/2013 |

OTHER PUBLICATIONS

Final Office Action dated Oct. 18, 2019 issued in U.S. Appl. No. 15/911,650.
Notice of Allowance dated Mar. 16, 2020 issued in U.S. Appl. No. 15/911,650.
Office Action dated Dec. 1, 2020 issued in JP patent application No. 2017-046224.
Notice of Allowance dated Jul. 6, 2021 issued in JP patent application No. 2017-046224.
Office Action dated Apr. 13, 2021 issued in CN patent application No. 201810178323.8.
Office Action dated Aug. 4, 2021 issued in TW patent application No. 107108102.

* cited by examiner

CONCENTRATION CONTROLLER, GAS CONTROL SYSTEM, DEPOSITION APPARATUS, CONCENTRATION CONTROL METHOD, AND PROGRAM RECORDING MEDIUM FOR CONCENTRATION CONTROLLER

TECHNICAL FIELD

The present invention relates to a concentration controller, a gas control system, a deposition apparatus, concentration control method, and a program for the concentration controller used in, for example, a semiconductor manufacturing process.

BACKGROUND ART

In the past, as equipment for controlling the concentration of gas used in a semiconductor manufacturing process or the like, as disclosed in Patent Literature 1, there has been a concentration controller used together with a vaporization apparatus for vaporizing liquid or solid material.

The vaporization apparatus intermittently supplies carrier gas to a vaporization tank storing the liquid or solid material, thereby intermittently leads out material gas produced by vaporization of the material from the vaporization tank, and supplies mixed gas produced by mixing diluent gas with the led-out material gas to a chamber or the like used in, for example, a semiconductor manufacturing process. In such a configuration, a supply period of supplying the mixed gas and a stop period of stopping the supply are repeated, and the concentration controller controls the flow rates of the carrier gas and diluent gas during the supply period, and thereby performs feedback control so that the concentration of the material gas contained in the mixed gas comes close to a preset target concentration.

However, in the above-described configuration, since the supply period and the stop period are repeated, the concentration of the material gas in the vaporization tank gradually increases during the stop period, and therefore there is the problem that the concentration of the material gas in the mixed gas overshoots immediately after the start of the supply period.

CITATION LIST

Patent Literatures

Patent Literature 1: Japanese Unexamined Patent Application Publication No. 2014-224307

SUMMARY OF INVENTION

Technical Problem

Therefore, the present invention has been made in order to solve the above-described problem, and a main object thereof is to control the flow rates of carrier and diluent gases so that the concentration of material gas can be prevented from overshooting immediately after the start of a supply period.

Solution to Problem

That is, the concentration controller according to the present invention is one used in a vaporization apparatus that includes: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on the downstream side of the merging point with the diluent gas supply path in the material gas lead-out path, and repeats supplying and stopping supplying the material gas.

In addition, the concentration controller includes: a concentration calculation part that calculates the concentration of the material gas on the basis of an output signal from the concentration monitor; and a set flow rate calculation part that, on the basis of actual concentration calculated by the concentration calculation part at a first predetermined time point during a supply period (hereinafter referred to as a first supply period) when the material gas is supplied, an actual flow rate outputted from the flow rate control device at the first, predetermined time point during the first supply period or the set flow rate of the flow rate control device at the first predetermined time point during the first supply period, and a preset target concentration, calculates the initial set flow rate of the flow rate control device during an initial interval that is a period from the start of a supply period (hereinafter referred to as a second supply period) after the first supply period to a second predetermined time point during.

The concentration controller configured as described above makes it possible to, in the flow rate control device during the initial interval of the second supply period, set the initial set flow rate calculated on the basis of the actual concentration calculated at the first predetermined time point during the first supply period, the actual flow rate outputted from the flow rate control device at the first predetermined time point during the first supply period or the set flow rate of the flow rate control device at the first predetermined time point during the first supply period, and the preset target concentration, and therefore overshoot immediately after the start of the second supply period can be reduced.

In order to more surely reduce the overshoot immediately after the start of the second supply period, it is preferable that during the initial interval of the second supply period, control is performed so that a flow rate through the flow rate control device becomes equal to the initial set flow rate.

It is preferable that the concentration controller is configured to, after the initial interval of the second supply period, perform feedback control by controlling the set flow rate of the flow rate control device so that the actual concentration calculated by the concentration calculation part comes close to the target concentration.

In such a configuration, even after the initial interval of the second supply period, the control can be stabilized.

Specific embodiments include one in which the set flow rate calculation part calculates the initial set flow rate during the initial interval of the second supply period by multiplying the ratio of the target concentration to the actual concentration calculated by the concentration calculation part at the first predetermined time point during an initial interval of the first supply period by the actual flow rate outputted from the flow rate control device at the first predetermined time point during the initial interval of the first supply period.

Also, other embodiments include one further including a flow rate-concentration relationship data storage part that stores flow rate-concentration relationship data indicating the relationship between the flow rate of the carrier gas or the flow rate of the diluent gas, and the concentration of the material gas flowing on the downstream side of the merging point with the diluent gas supply path in the material gas lead-out path, in which the set flow rate calculation part calculates the initial set flow rate during the initial interval of the second supply period with use of the flow rate-concentration relationship data.

It is preferable that the set flow rate calculation part calculates an average initial set flow rate resulting from averaging initial set flow rates respectively calculated for multiple supply periods when the material gas has already been supplied.

By setting the average initial set flow rate in the flow rate control device, respective errors of the calculated initial set flow rates can be reduced, and the overshoot immediately after the start of the second supply period can be more surely reduced.

When the relationship between the flow rate and the concentration does not match a calculation expression for the initial set flow rate, an increase in initial concentration and a decrease in initial concentration may be alternately repeated during successive supply periods.

Therefore, it is preferable that the average initial set flow rate is one resulting from averaging the initial set flow rates calculated by the set flow rate calculation part respectively for successive even-numbered supply periods.

In such a configuration, since the successive even-numbered estimated flow rates are averaged, increases in initial concentration and decreases in initial concentration can be cancelled out.

Also, the gas control system according to the present invention includes an vaporization apparatus that includes: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on the downstream side of the merging point with the diluent gas supply path in the material gas lead-out path, and repeats supplying and stopping supplying the material gas, a concentration calculation part that calculates the concentration of the material gas on the basis of an output signal from the concentration monitor, and a set flow rate calculation part that, on the basis of initial concentration calculated by the concentration calculation part at a first predetermined time point during a supply period (hereinafter referred to as a first supply period) when the material gas is supplied, an actual flow rate outputted from the flow rate control device at the first predetermined time point during the first supply period or the set flow rate of the flow rate control device at the first predetermined time point during the first supply period, and a preset target concentration, calculates the initial set flow rate of the flow rate control device during an initial interval that is a period from the start of a supply period (hereinafter referred to as a second supply period) after the first supply period to a second predetermined time point.

A deposition apparatus including the above-described gas control system and a chamber to be supplied with the material gas is also included in the present invention.

The concentration control method according to the present invention is one used for a vaporization apparatus that includes: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on the downstream side of the merging point with the diluent gas supply path in the material gas lead-out path, and repeats supplying and stopping supplying the material gas. In addition, the concentration control method includes: a step of calculating the concentration of the material gas on the basis of an output signal from the concentration monitor; and a step of, on the basis of initial concentration calculated at a first predetermined time point during a supply period (hereinafter referred to as a first supply period) when the material gas is supplied, an actual flow rate outputted from the flow rate control device at the first predetermined time point during the first supply period or the set flow rate of the flow rate control device at the first predetermined time point during the first supply period, and a preset target concentration, calculating the initial set flow rate of the flow rate control device during an initial interval that is a period from the start of a supply period (hereinafter referred to as a second supply period) after the first supply period to a second predetermined time point.

The program for a concentration controller according to the present invention is one used for a vaporization apparatus that includes: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on the downstream side of the merging point with the diluent gas supply path in the material gas lead-out path, and repeats supplying and stopping supplying the material gas. In addition, the program instructs a computer to fulfill functions as: a concentration calculation part that calculates the concentration of the material gas on the basis of an output signal from the concentration monitor; and a set flow rate calculation part that, on the basis of initial concentration calculated by the concentration calculation part at a first predetermined time point during a supply period (hereinafter referred to as a first supply period) when the material gas is supplied, an actual flow rate outputted from the flow rate control device at the first predetermined time point during the first supply period or the set flow rate of the flow rate control device at the first predetermined time point during the first supply period, and a preset target concentration, calculates the initial set flow rate of the flow rate control device during an initial interval that is a period from the start of a supply period (hereinafter referred to as a second supply period) after the first supply period to a second predetermined time point.

Such gas control system, deposition apparatus, concentration control method, and program for a concentration controller can produce the same working effect as that of the above-described concentration controller.

Advantageous Effects of Invention

According to the present invention configured as described above, in a configuration adapted to intermittently supply the material gas, the flow rates of the carrier and diluent gases can be controlled so as to suppress the concentration of the material gas from overshooting immediately after the start of a supply period.

DESCRIPTION OF EMBODIMENTS

In the following, one embodiment of the concentration controller according to the present invention will be described with reference to the drawings.

A gas control system 100 of the present embodiment is one incorporated in, for example, a semiconductor manufacturing line or the like to supply a predetermined concentration of gas to a chamber CH used in the semiconductor manufacturing process. In addition, together with the chamber CH, the gas control system 100 constitutes a deposition apparatus used in semiconductor manufacturing or the like.

Figure 1:
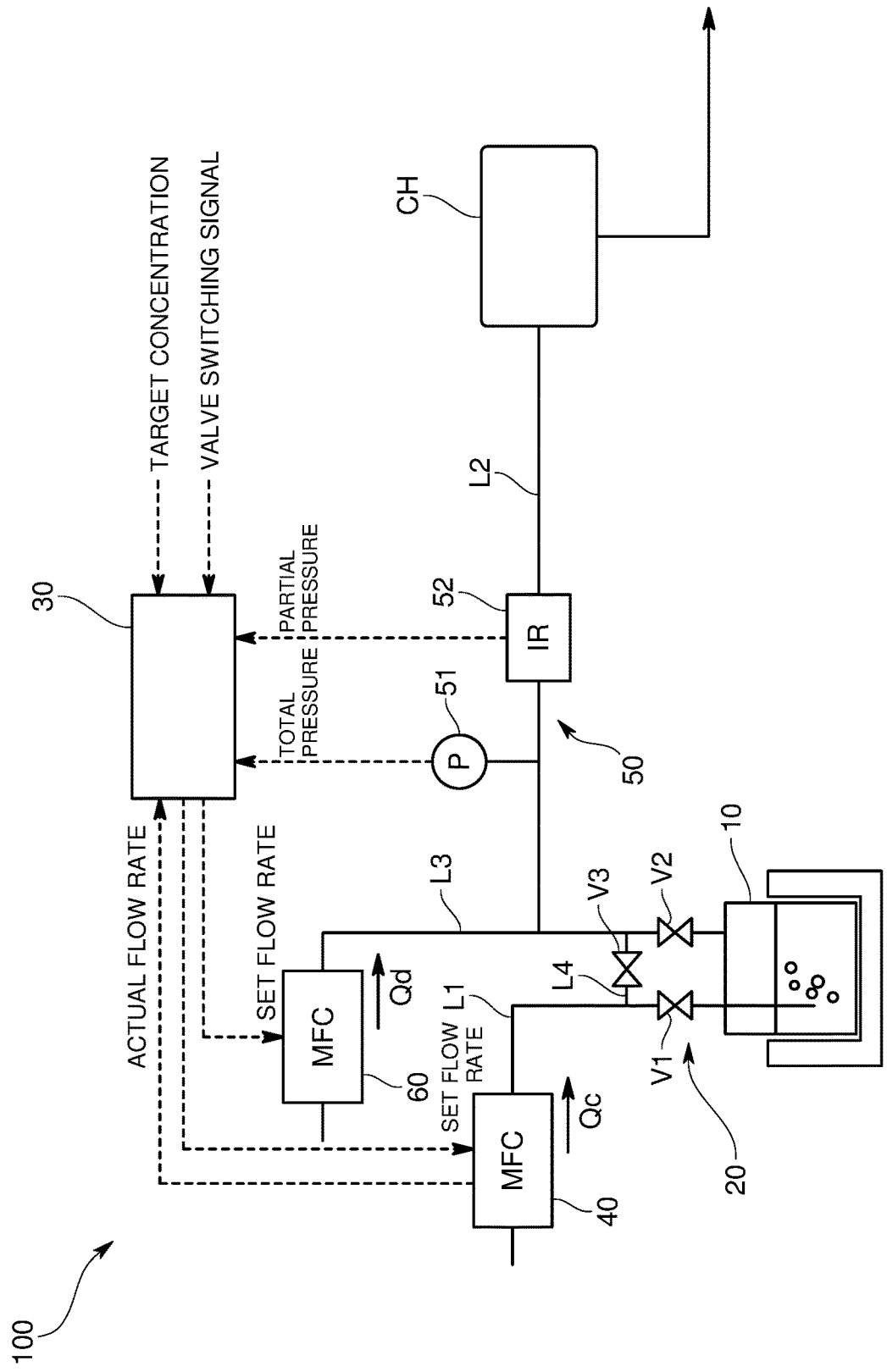
FIG. 1 is a diagram schematically illustrating the overall configuration of a gas control system of the present embodiment.

Specifically, as illustrated in FIG. 1, the gas control system 100 includes: a vaporization tank 10 that stores liquid or solid material; a carrier gas supply path L1 that supplies carrier gas to the vaporization tank 10; a material gas lead-out path L2 that leads out material gas produced by vaporization of the material from the vaporization tank 10; a diluent gas supply path L3 that supplies diluent gas for diluting the material gas to the material gas lead-out path L2; a switching mechanism 20 for switching between supplying the material gas to the chamber CH and stopping the supply; and a concentration controller 30 that controls the concentration of the material gas to be supplied to the chamber CH.

The carrier gas supply path L1 is provided with a first flow rate control device 40 for controlling the flow rate of the carrier gas. The first flow rate control device 40 is a mass flow controller including: a flow rate sensor of, for example, a thermal type; a flow rate regulation valve such as a piezo valve; and a control circuit including a CPU, a memory, and the like.

The material gas lead-out path L2 is provided with a concentration monitor 50 for measuring the concentration of the material gas contained in mixed gas. The concentration monitor 50 in the present embodiment is one using the principle that the concentration (vol %) of the material gas contained in the mixed gas is represented by the ratio of the pressure (partial pressure) of the material gas contained in the mixed gas to the pressure (total pressure) of the mixed gas, and specifically, includes: a pressure meter 51 for measuring the total pressure; and a partial pressure meter 52 for measuring the partial pressure using, for example, a non-dispersive infrared absorption method.

The diluent gas supply path L3 is connected to the upstream side of the temperature monitor 50 in the material gas lead-out path L2, and provided with a second flow rate control device 60 for controlling the flow rate of the diluent gas. As with the first flow rate control device 40, the second flow rate control device 60 is a mass flow controller including: a flow rate sensor of, for example, a thermal type; a flow rate regulation valve such as a piezo valve; and a control circuit including a CPU, a memory, and the like.

Figure 2:
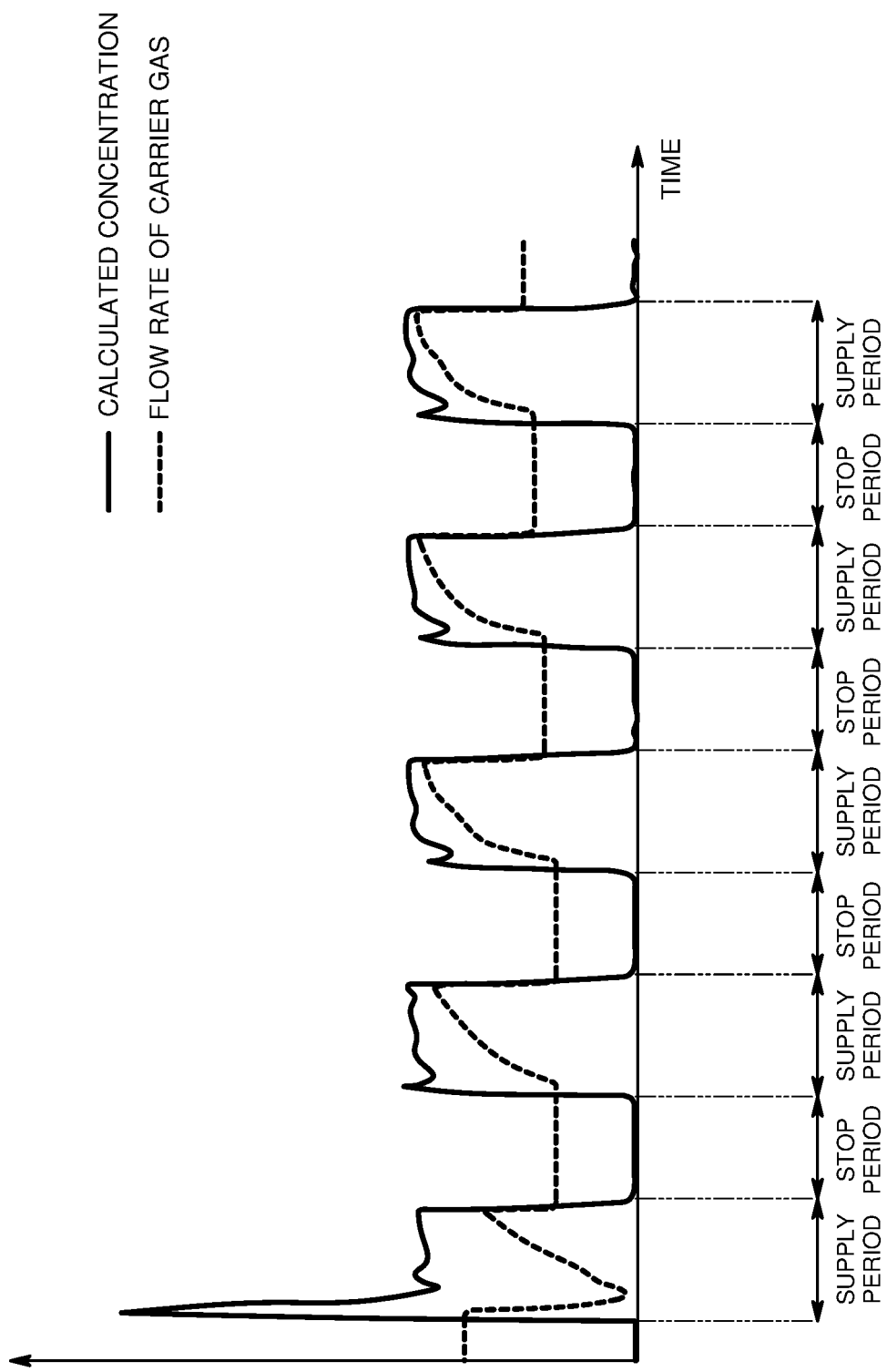
FIG. 2 is a graph illustrating the intermittent flow of material gas in the gas control system of the same embodiment.

The switching mechanism 20 includes multiple valves V1 to V3 that receive a valve switching signal to open/close, and by opening/closing these valves V1 to V3, for example, at timing preset by a user, supplying and stopping supplying the carrier gas to the vaporization tank 10 are repeated. As a result, as illustrated in FIG. 2, the material gas is intermittently led out of the vaporization tank 10 and intermittently supplied to the chamber CH. That is, the gas control system 100 of the present embodiment is configured to repeat a supply period of supplying the material gas (specifically, the mixed gas produced by mixing the material gas and the diluent gas) to the chamber CH and a stop period of stopping the supply.

The switching mechanism 20 here includes: a bypass flow path L4 connecting between the carrier gas supply path L1 and the material gas lead-out path L2; a first valve V1 provided on the downstream side of a connection point with the bypass flow path L4 in the carrier gas supply path L1; a second valve V2 provided on the upstream side of a connecting point with the bypass flow path L4 in the material gas lead-out path L2; and a third valve V3 provided in the bypass flow path L4.

In addition, the supply period is started by opening the first and second valves V1 and V2 and closing the third valve V3, whereas the stop period is started by closing the first and second valves V1 and V2 and opening the third valve V3.

The concentration controller 30 is one that controls the flow rates of the carrier gas and diluent gas and thereby controls the concentration of the material gas to be supplied to the chamber CH.

Figure 3:
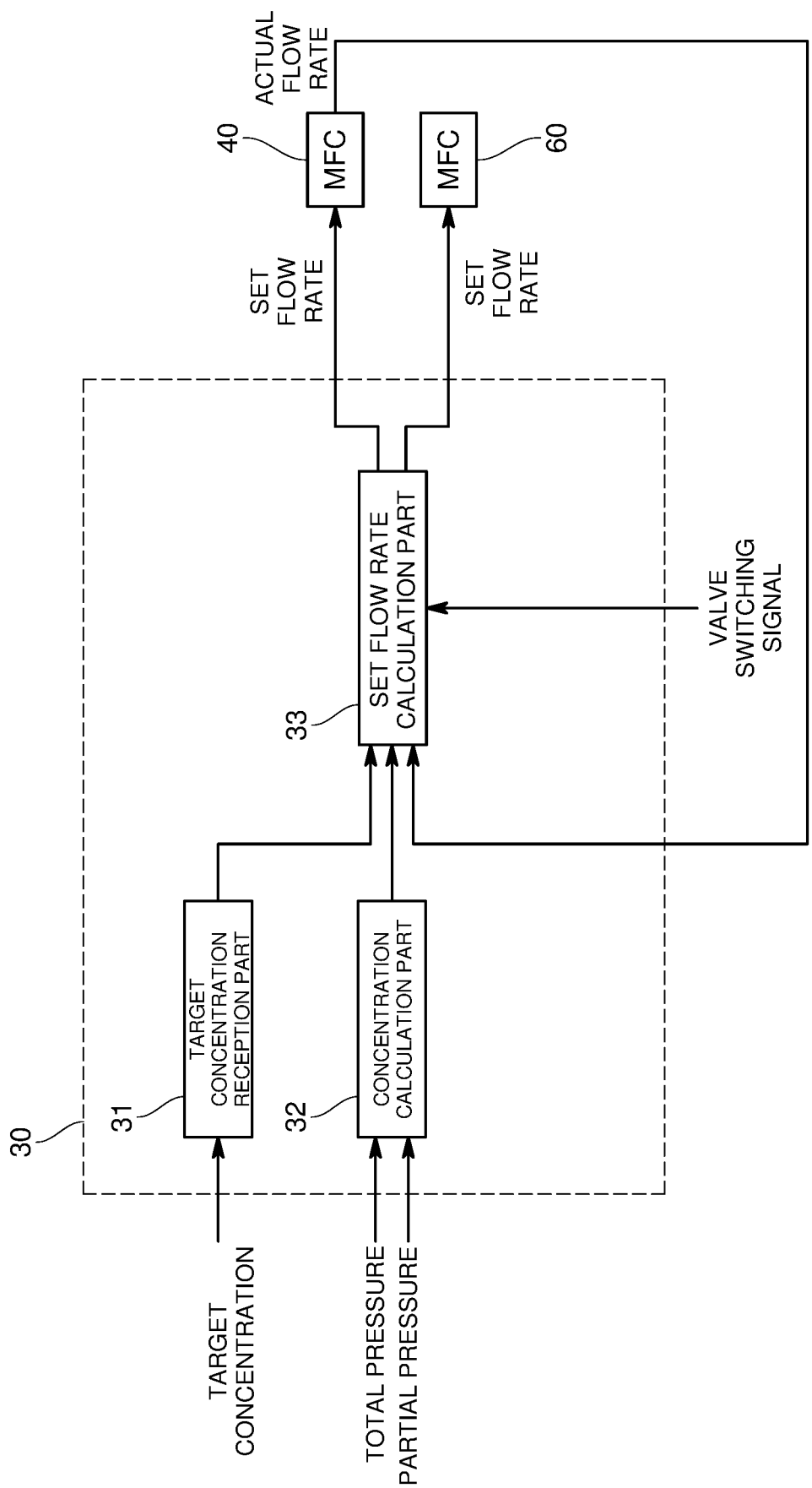
FIG. 3 is a functional block diagram illustrating functions of a concentration controller of the same embodiment.

Specifically, the concentration controller 30 is a computer having a CPU, a memory, an AC/DC converter, input means, and the like. In addition, the CPU executes a program stored in the memory, and thereby as illustrated in FIG. 3, the concentration controller 30 has functions as a target concentration reception part 31, a concentration calculation part 32, and a set flow rate calculation part 33.

The target concentration reception part 31 is one that receives a target concentration signal indicating a target concentration inputted by user's input operation through the input means such as a keyboard or transmitted from another device.

The concentration calculation part 32 is one that on the basis of output signals outputted from the concentration monitor 50, calculates the concentration (hereinafter also referred to as actual concentration) of the material gas contained in the mixed gas. Specifically, the concentration calculation part 32 acquires the output signals respectively from the pressure meter 51 and the partial pressure meter 52, and calculates the ratio of the partial pressure detected by the partial pressure meter 52 to the total pressure detected by the pressure meter 51 as the actual concentration (vol %) of the material gas contained in the mixed gas.

The set flow rate calculation part 33 is one that acquires an actual concentration signal outputted from the concentration calculation part 32 and the target concentration signal received by the target concentration reception part 31, and calculates a set flow rate (hereinafter referred to as an FB set flow rate) for feedback control of the first flow rate control device 40.

Figure 4:
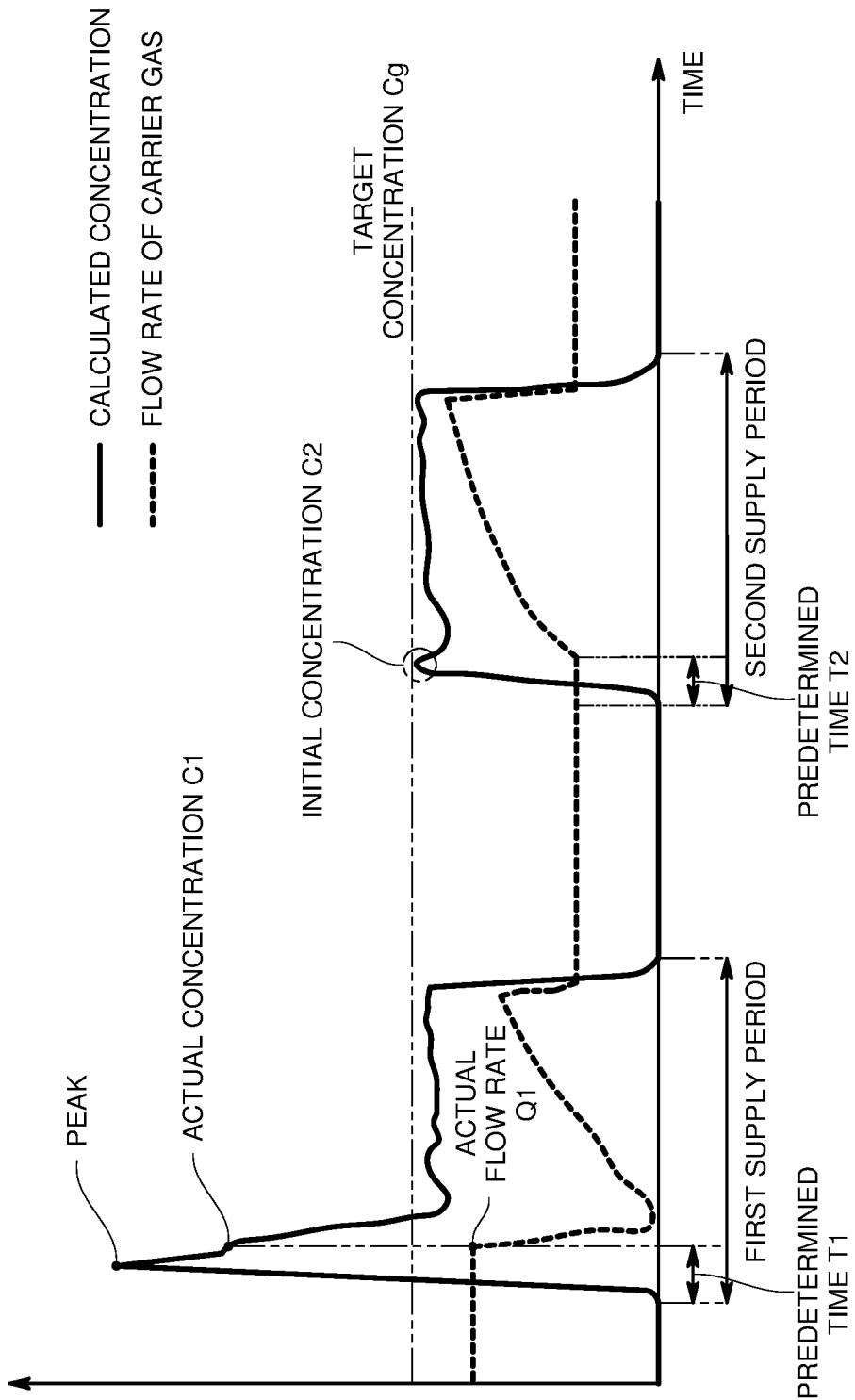
FIG. 4 is a graph for explaining an initial set flow rate calculation method of the same embodiment.

Further, in the present embodiment, as illustrated in FIG. 4, the set flow rate calculation part 33 is configured to, on the basis of the target concentration Cg received by the target concentration reception part 31, the actual concentration C1 calculated by the concentration calculation part 32 at a predetermined time point during an initial interval of a supply period (hereinafter referred to as a first supply period) when the material gas is supplied, and the actual flow rate Q1 of the carrier gas outputted from the first flow rate control device 40 at the predetermined time point during the initial interval of the first supply period, calculate the initial set flow rate Q2 of the first flow rate control device 40 during an initial interval of a supply period (hereinafter referred to as a second supply period) after the first supply period.

Note that "the initial interval of the first supply period" refers to a period from the start of the first supply period to a first predetermined time point after a preset first predetermined time T1 has passed. The first predetermined time point is set to a time point when the peak of the actual concentration first appears during the first supply period or set to around the time, and here set to a time point when the first peak of the actual concentration finishes falling.

Also, "the initial interval of the second supply period" refers to a period from the start of the second supply period to a second predetermined time point after a preset second predetermined time T2 has passed, and here the second predetermined time T2 is set to the same time as the first predetermined time T1. That is, as with the first predetermined time point, the second predetermined time period is set to a time point when the peak of the actual concentration first appears during the second supply period or set to around the time, and here set to a time point when the first peak of the actual concentration finishes falling.

Specifically, the set flow rate calculation part 33 acquires the actual concentration C1 calculated by the concentration calculation part 32 at the first predetermined time point during the initial interval of the first supply period and the actual flow rate Q1 of the carrier gas calculated by the CPU of the first flow rate control device at the first predetermined time point during the initial interval of the first supply period, and calculates the initial set flow rate Q2 during the second supply period using a predetermined calculation expression.

In the present embodiment, on the assumption that there is a proportional relationship between the concentration of the material gas contained in the mixed gas and the flow rate of the carrier gas, the set flow rate calculation part 33 uses the following calculation expression to calculate the initial set flow rate Q2 during the second supply period after the first supply period.

$$\text{Initial set flow rate } Q2 = \text{Actual flow rate } Q1 \times (\text{Target concentration } Cg/\text{Actual concentration } C1)$$

The set flow rate calculation part 33 in the present embodiment outputs the initial set flow rate during the initial interval of the second supply period calculated in accordance with the above-described calculation expression to the first flow rate control device 40. On the other hand, after the initial interval of the second supply period, the set flow rate calculation part 33 outputs the above-described FB set flow rate to the first flow rate control device 40.

In the present embodiment, as described above, control is performed so that the total flow rate of the carrier gas flow rate and the diluent gas flow rate becomes constant, and the set flow rate calculation part 33 subtracts the set flow rate to be outputted to the first flow rate control device 40 from the predetermined total flow rate, and calculates and outputs the set flow rate of the second flow rate control device 60.

Figure 5:
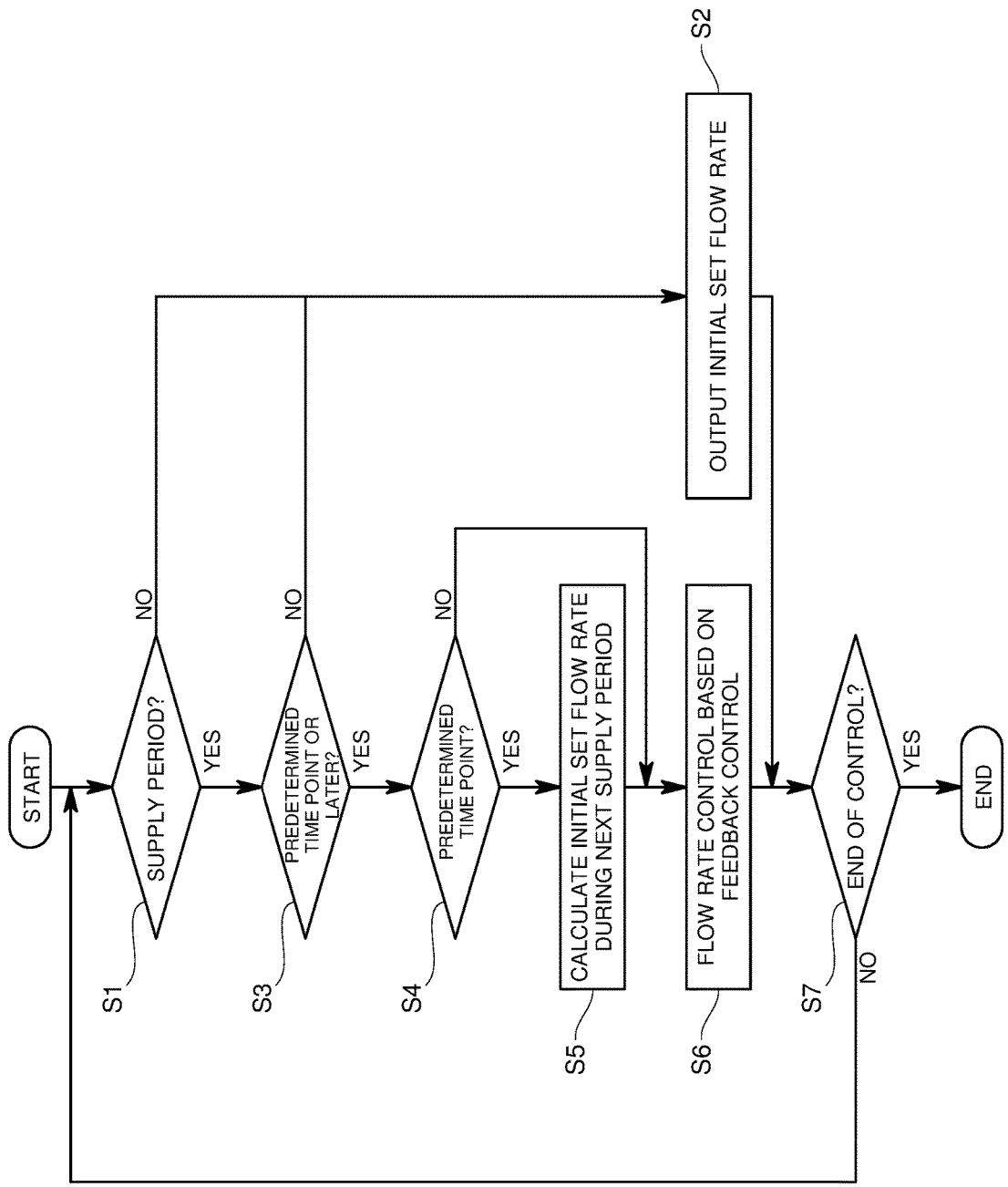
FIG. 5 is a flowchart illustrating the operation of the concentration controller of the same embodiment.

Next, the operation of the concentration controller 30 of the present embodiment will be described with reference to a flowchart of FIG. 5. Note that in the following description of the operation, for the purpose of convenience, the first supply period and the second supply period are simply referred to as supply periods, and the first predetermined time and the second predetermined time are set to the same time, and therefore simply referred to as a predetermined time.

First, when the operation of the control system 100 is started, the concentration controller 30 determines whether or not the current time point is within the supply period. Here, the set flow rate calculation part 33 acquires the valve switching signal and on the basis of the signal, determines whether or not the current time point is within the supply period (S1).

When it is determined in S1 that the current time point is not within the supply period, i.e., when it is determined that the current time point is within the stop period, the set flow rate calculation part 33 sets the flow rates of the first flow rate control device 40 and the second flow rate control device and 60 to initial set flow rates calculated in S5 described later, and keeps the initial set flow rates (S2). In addition, during the stop period until the first supply period is started after the start of the operation of the gas control system 100, for example, a user keeps output of preset set flow rates respectively for the first flow rate control device 40 and the second flow rate control device 60.

On the other hand, when it is determined in S1 that the current time point is within the supply period, the set flow rate calculation part 33 determines whether or not the current time point is the predetermined time point or later (S3).

When it is determined in S3 that the current time point is not the predetermined time point or later, i.e., when it is determined that the current time point is within the initial interval of the supply period, the set flow rate calculation part 33 keeps output of the set flow rate set for the first flow rate control device 40, i.e., keeps output of the initial set flow rate regardless of the actual concentration (S2).

When it is determined in S3 that the current time point is the predetermined time point or later, the set flow rate calculation part 33 determines whether or not the current time point is the predetermined time point (S4).

When it is determined in S4 that the current time point is the predetermined time point, the set flow rate calculation part 33 calculates an initial set flow rate during the next supply period (S5). In addition, a detailed calculation method is as described above.

On the other hand, when it is determined in S4 that the current time point is not the predetermined time point, without calculating the above-described initial set flow rate, the set flow rate calculation part 33 outputs the FB set flow rate to the first flow rate control device 40 to feedback-control the concentration of the material gas (S6).

In addition, in S2 and S6, the set flow rate calculation part 33 subtracts the set flow rate to be outputted to the first flow rate control device 40 from the predetermined total flow rate, and calculates and outputs the set flow rate of the second flow rate control device 60.

After that, it is determined whether or not a control end signal by the concentration controller 30 has been received (S7), and until the control end signal is received, S1 to S7 are repeated. When the control end signal is received, the operation is ended.

In the gas control system 100 according to the present embodiment configured as described above, as illustrated in FIG. 4, the set flow rate calculation part 33 calculates the initial set flow rate Q2 during the second supply period on the basis of the target concentration Cg, the actual flow rate Q1 at the first predetermined time point during the initial interval of the first supply period, and the actual concentration C1 at the first predetermined time point during the initial interval of the first supply period, and outputs the initial set flow rate Q2 to the first flow rate control device for the initial interval of the second supply period. Accordingly, the initial concentration C2 during the second supply period can be brought close to the target concentration Cg, and therefore overshoot immediately after the start of the second supply period can be suppressed.

Note that the present invention is not limited to the above-described embodiment.

For example, the set flow rate calculation part 33 in the above-described embodiment calculates the initial set flow rate of the first flow rate control device 40 during the second supply period, but may calculate the initial set flow rate of the second flow rate control device 60 during the second supply period. Specific configurations include one in which on the basis of the target concentration, the actual concentration calculated by the concentration calculation part 32 at the predetermined time point during the initial interval of the first supply period, and the actual flow rate of the diluent gas outputted from the second flow rate control device 60 at the predetermined time point during the initial interval of the first supply period, the set flow rate calculation part 33 calculates the initial set flow rate of the second flow rate control device 60 during the initial interval of the second supply period.

In this case, the initial set flow rate of the first flow rate control device is only required to be a flow rate obtained by subtracting the initial set flow rate of the second flow rate control device from the predetermined total flow rate.

Also, to calculate the initial set flow rate Q2 during the second supply period, without limitation to the calculation expression in the above-described embodiment, for example, in place of the actual flow rate Q1, the initial set flow rate Q1' of the first flow rate control device 40 at the predetermined time point during the initial interval of the first supply period may be used to use the following calculation expression.

Initial set flow rate $Q2$ = Initial set flow rate $Q1' \times$ (Target concentration $Cg$/Actual concentration $C1$)

Further, the calculation expression for the initial set flow rate Q2 does not have to be limited to that in the above-described embodiment.

For example, an embodiment in which the concentration controller 30 further includes a flow rate-concentration relationship data storage part for storing flow rate-concentration relationship data indicating the relationship between the flow rate of the carrier or diluent gas and the concentration of the material gas flowing on the downstream side of the merging point with the diluent gas supply path in the material gas lead-out path, and the set flow rate calculation part 33 uses the flow rate-concentration relationship data to calculate the initial set flow rate during the second supply period can be cited.

The flow rate-concentration relationship data may be, for example, a calculation expression applicable when there is no proportional relationship between the concentration of the material gas contained in the mixed gas and the flow rate of the carrier gas or diluent gas, such as a nonlinear calculation expression different from the calculation expression in the above-described embodiment.

Even when there is no proportional relationship between the concentration of the material gas contained in the mixed gas and the flow rate of the carrier gas or diluent gas, by using such flow rate-concentration relationship data, the initial set flow rate during the second supply period can be accurately calculated.

The calculation timing of the initial set flow rate by the set flow rate calculation part 33 is not limited to the predetermined time point in the above-described embodiment. For example, as long as the actual concentration C1 and the actual flow rate Q1 at the predetermined time point are temporarily stored in the memory, the calculation may be performed after the predetermined time point.

The above-described embodiment is configured to, at the end of the first supply period, output the initial set flow rate during the next second supply period. However, the output timing is not limited to this, but may be, for example, any timing during the stop period from the first supply period to the next second supply period, or may be, for example, immediately after the start of the second supply period as long as the overshoot can be reduced.

The set flow rate calculation part 33 may be configured to calculate an average initial set flow rate obtained by averaging initial set flow rates respectively calculated for multiple supply periods when the material gas has already been supplied.

In such a configuration, by setting the average initial set flow rate in the flow rate control device during the initial interval of the supply period, the errors of the respective calculated initial set flow rates can be reduced, and therefore the overshoot during the initial interval of the supply period can be more surely reduced.

Also, when the relationship between the flow rate and the concentration does not match the calculation expression for the initial set flow rate, an increase in initial concentration and a decrease in initial concentration may be alternately repeated during successive supply periods.

For this reason, it is preferable that the set flow rate calculation part 33 calculates the above-described average initial set flow rate by averaging initial set flow rates respectively calculated for successive even-numbered supply periods including a supply period immediately before a supply period for which an initial set flow rate is to be set.

In such a configuration, increases in initial concentration and decreases in initial concentration during successive supply periods are averaged and cancelled out, and therefore the initial set flow rate for bringing the actual concentration close to the target concentration can be more accurately set.

The concentration controller 30 of the above-described embodiment is configured so that the set flow rate calculation part 33 calculates and outputs both of the FB set flow rate and the initial set flow rate. However, the concentration controller may include the function of calculating the FB set flow rate and the function of calculating the initial set flow rate separately.

Also, for example, when the actual concentration during the initial interval of the first supply period exceeds a preset threshold value, the set flow rate calculation part 33 may calculate the initial set flow rate during the second supply period on the basis of the actual concentration (threshold value) at the time and the actual flow rate at the time. In this case, a time point when the actual concentration exceeds the threshold value is the predetermined time point.

The first flow rate control device 40 and the second flow rate control device 60 may be mass flow controllers including differential pressure type flow rate sensors.

Also, as the first flow rate control device 40 and the second flow rate control device 60, flow rate control valves such as piezo valves may be used without using mass flow controllers.

The concentration monitor 50 may be one that directly measures the concentration of the material gas by, for example, ultrasonic waves. Also, the concentration monitor 50 may be adapted to include a function as the concentration calculation part 32, and output the concentration to the concentration controller 30.

Although the gas control system of a bubbler type (bubbling type) is described, a control method may be basically any method, and only has to be one using carrier gas. For example, the gas control system 100 may be one not including the second flow rate control device 60. As the gas control system 100 in this case, for example, one configured to provide a valve such as a piezo valve downstream of the concentration monitor 50 in the material gas lead-out path L2 and perform pressure control of the supply amount of the material gas by controlling the opening level of the valve can be cited. Further, the present invention is also applicable to a gas control system of a DLI type (direct vaporization type) that carries material in a liquid state and vaporizes it near a use point (e.g., a deposition chamber) to perform flow rate control.

The concentration controller of the above-described embodiment is one that suppresses the concentration of the material gas from overshooting immediately after the start of the supply period. However, the concentration controller of the present invention may be one that suppresses the concentration of the material gas from undershooting immediately after the start of the supply period.

Besides, it should be appreciated that the present invention is not limited to the above-described embodiments, but can be variously modified without departing from the scope thereof.

REFERENCE SIGNS LIST

100: Gas control system
10: Vaporization tank
L1: Carrier gas supply path
L2: Material gas lead-out path
L3: Diluent gas supply path
30: Concentration controller
31: Target concentration reception part
32: Concentration calculation part
33: Set flow rate calculation part
50: Concentration monitor

The invention claimed is:

1. A concentration controller used in a vaporization apparatus that comprises: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on a downstream side of a merging point with the diluent gas supply path in the material gas lead-out path, and repeats supplying and stopping supplying the material gas, the concentration controller comprising:

a concentration calculator that calculates concentration of the material gas on a basis of an output signal from the concentration monitor; and a set flow rate calculator that, on a basis of actual concentration calculated by the concentration calculator at a first predetermined time point during a first supply period when the material gas is supplied, an actual flow rate outputted from the flow rate control device at the first predetermined time point during the first supply period or a set flow rate of the flow rate control device at the first predetermined time point during the first supply period, and preset target concentration, calculates an initial set flow rate of the flow rate control device during an initial interval that is a period to a second predetermined time point during a second supply period after the first supply period.

2. The concentration controller according to claim 1, wherein
during the initial interval of the second supply period, control is performed so that a flow rate through the flow rate control device becomes equal to the initial set flow rate.

3. The concentration controller according to claim 1, wherein
after the initial interval of the second supply period, feedback control is performed by controlling the set flow rate of the flow rate control device so that the actual concentration calculated by the concentration calculator comes close to the target concentration.

4. The concentration controller according to claim 1, wherein
the set flow rate calculator calculates the initial set flow rate during the initial interval of the second supply period by multiplying a ratio of the target concentration to the actual concentration calculated by the concentration calculator at the first predetermined time point during an initial interval of the first supply period by the actual flow rate outputted from the flow rate control device at the first predetermined time point during the initial interval of the first supply period.

5. The concentration controller according to claim 1, further comprising
a flow rate-concentration relationship data storage part that stores flow rate-concentration relationship data indicating a relationship between a flow rate of the carrier gas or a flow rate of the diluent gas, and the concentration of the material gas flowing on the downstream side of the merging point with the diluent gas supply path in the material gas lead-out path, wherein
the set flow rate calculator calculates the initial set flow rate during the initial interval of the second supply period with use of the flow rate-concentration relationship data.

6. The concentration controller according to claim 1, wherein
the set flow rate calculator calculates an average initial set flow rate resulting from averaging initial set flow rates respectively calculated for multiple supply periods when the material gas has already been supplied.

7. The concentration controller according to claim 6, wherein the average initial set flow rate is one resulting from averaging the initial set flow rates calculated by the set flow rate calculator respectively for successive even-numbered supply periods.

8. A gas control system comprising an vaporization apparatus that comprises: a vaporization tank that stores liquid or solid material; a carrier gas supply path that supplies carrier gas to the vaporization tank; a material gas lead-out path through which material gas produced by vaporization of the material and led out of the vaporization tank flows; a diluent gas supply path that merges with the material gas lead-out path and supplies diluent gas to the material gas lead-out path; a flow rate control device provided in at least one of the carrier gas supply path and the diluent gas supply path; and a concentration monitor provided on a downstream side of a merging point with the diluent gas supply path in the material gas lead-out path, and repeats supplying and stopping supplying the material gas, and the concentration controller according to claim 1.

9. A deposition apparatus comprising:

the gas control system according to claim 8; and a chamber to be supplied with the material gas.

* * * * *